United States Patent
Nakajima et al.

(10) Patent No.: US 11,862,739 B2
(45) Date of Patent: Jan. 2, 2024

(54) PHOTORECEIVER AND OPTICAL RECEIVER HAVING AN INCLINED SURFACE

(71) Applicant: Nippon Telegraph and Telephone Corporation, Tokyo (JP)

(72) Inventors: Fumito Nakajima, Tokyo (JP); Hideaki Matsuzaki, Tokyo (JP); Yuki Yamada, Tokyo (JP); Masahiro Nada, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 165 days.

(21) Appl. No.: 17/436,957

(22) PCT Filed: Apr. 3, 2020

(86) PCT No.: PCT/JP2020/015362
§ 371 (c)(1),
(2) Date: Sep. 7, 2021

(87) PCT Pub. No.: WO2020/213436
PCT Pub. Date: Oct. 22, 2020

(65) Prior Publication Data
US 2022/0173259 A1    Jun. 2, 2022

(30) Foreign Application Priority Data

Apr. 18, 2019  (JP) ................. 2019-079045

(51) Int. Cl.
*H01L 31/0232* (2014.01)
*G02B 5/08* (2006.01)
(Continued)

(52) U.S. Cl.
CPC .......... *H01L 31/02327* (2013.01); *G02B 5/08* (2013.01); *H01L 31/02325* (2013.01);
(Continued)

(58) Field of Classification Search
CPC ......... H01L 31/02327; H01L 31/02325; H01L 31/02366; H01L 31/03046; H01L 31/105;
(Continued)

(56) References Cited

U.S. PATENT DOCUMENTS 5,721,429 A * 2/1998 Radford ............ H01L 27/14627
257/E27.137

FOREIGN PATENT DOCUMENTS

JP      S62282470 A    12/1987
JP       S631062 A     1/1988
(Continued)

OTHER PUBLICATIONS

Tsunashima et al., "Silica-based, compact and variable-optical-attenuator integrated coherent receiver with stableoptoelectronic coupling system," Optics Express, vol. 20, No. 24, Nov. 19, 2012, pp. 27174-27179.

*Primary Examiner* — Que Tan Le
*Assistant Examiner* — Mai Thi Ngoc Tran
(74) *Attorney, Agent, or Firm* — Slater Matsil, LLP (57) ABSTRACT

A light-receiving device includes: a plurality of light-receiving elements arranged in a row on a main surface of a substrate and a first reflection surface and a second reflection surface formed on the substrate to extend in the arrangement direction with the row of the plurality of light-receiving elements interposed therebetween. Each of the first reflection surface and the second reflection surface includes an inclined surface forming one flat surface formed from a main surface of the substrate on which each light-receiving element is formed to a back surface side of the substrate.

8 Claims, 8 Drawing Sheets

(51) Int. Cl.
*H01L 31/0236* (2006.01)
*H01L 31/0304* (2006.01)
*H01L 31/105* (2006.01)

(52) U.S. Cl.
CPC .. *H01L 31/02366* (2013.01); *H01L 31/03046* (2013.01); *H01L 31/105* (2013.01)

(58) Field of Classification Search
CPC ..... H01L 31/022408; H01L 31/035281; H01L 27/144; G02B 5/08; G02B 5/0858; G02B 6/4214; G02B 6/4215; G02B 6/425
USPC ........................ 250/214 R, 216, 239, 227.32
See application file for complete search history.

(56) References Cited

FOREIGN PATENT DOCUMENTS

| | | | |
|---|---|---|---|
| JP | 2000150923 | A | 5/2000 |
| JP | 3589878 | B2 | 11/2004 |
| JP | 2010118412 | A | 5/2010 |
| JP | 2011151421 | A | 8/2011 |
| WO | 2015097764 | A1 | 7/2015 |

\* cited by examiner

PHOTORECEIVER AND OPTICAL RECEIVER HAVING AN INCLINED SURFACE

CROSS-REFERENCE TO RELATED APPLICATIONS

This application is a national phase entry of PCT Application No. PCT/JP2020/015362, filed on Apr. 3, 2020, which claims priority to Japanese Application No. 2019-079045, filed on Apr. 18, 2019, which applications are hereby incorporated herein by reference.

TECHNICAL FIELD

The present disclosure relates to a light-receiving device including a plurality of light-receiving elements and a light receiver.

BACKGROUND

With the recent increase in communication capacity in data centers and the like, signal light is multiplexed and transmitted in optical communication. In order to cope with such signal transmission, an optical filter that demultiplexes light and a photodiode that converts light into electricity are integrated in a light receiver (see Non Patent Literature 1).

Figure 5:
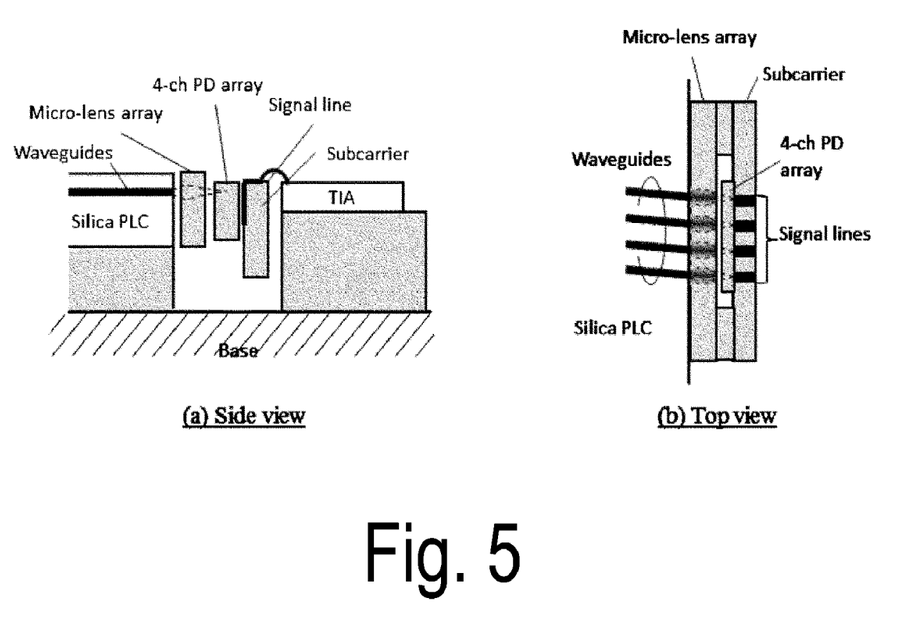
FIG. 5 is an explanatory diagram described in Non Patent Literature 1.

In Non Patent Literature 1, a planar silica optical waveguide (Silica PLC) which is a waveguide type optical filter is used as the optical filter, and a lens array (micro-lens array) and a photodiode array (4-ch PD array) flip-chip mounted on a subcarrier are bonded to a light emitting end surface (see FIG. 5). In this technique, a surface-type photodiode having excellent mass productivity, which thus can be manufactured at low cost, is used. Further, the above-described technique employs a configuration in which light is perpendicularly incident on a light-receiving surface of the surface-type photodiode.

In order to further increase the communication capacity, the baud rate of the optical signal needs to be increased and the speed of the photodiode needs to be increased. One technique for increasing the speed of a photodiode is a method of thinning a light absorbing layer to shorten the traveling time of a carrier generated by light reception. However, if the light absorbing layer is thinned, the light-receiving sensitivity deteriorates. Therefore, there is a trade-off relationship between high speed and light-receiving sensitivity.

In order to improve the problem of the trade-off in the photodiode, a technique is known in which a groove is formed in a substrate on the side of a region where a photodiode is formed to provide an inclined surface reflection portion (total reflection mirror), and light incident from a back surface side of the substrate provided with the photodiode is reflected by the inclined surface reflection portion, so that the light is incident on a light absorbing layer from an inclined direction (see Patent Literature 1). In this technique, the light incident on the light absorbing layer from the inclined direction is reflected by a reflection layer formed by an upper electrode formed in an upper portion of the element, is incident on the light absorbing layer again, and is emitted to the outside of the element.

CITATION LIST

Patent Literature

Patent Literature 1: JP 3589878B

Non Patent Literature

Non Patent Literature 1: S. Tsunashima et al., "Silica-based, compact and variable-optical attenuator integrated coherent receiver with stable optoelectronic coupling system", Optics Express, vol. 20, no. 24, pp. 27174-27179, 2012.

SUMMARY

Technical Problem

As described above, the light receiver for optical communication of multiplexed signal light includes an array chip (light-receiving device) in which a plurality of surface-type photodiodes are arranged. When the plurality of arranged surface-type photodiodes are used in this way and the inclined surface reflection portion is provided on the side of the element, there is an advantage of improving the sensitivity, which however causes the following problem. That is, signal light which is reflected by the inclined surface reflection portion, is incident on the light absorbing layer, and is emitted to the outside of the element is incident on light absorbing layers of the other elements and causes crosstalk.

The present disclosure has been made to solve the above-described problems and an objective is to suppress crosstalk in a light-receiving device in which a plurality of surface-type photodiodes are arranged.

Means for Solving the Problem

A light-receiving device according to the present disclosure includes: a plurality of light-receiving elements arranged in a row on a substrate; and a first reflection surface and a second reflection surface formed on the substrate to extend in an arrangement direction with the row of the plurality of light-receiving elements interposed therebetween, wherein each of the plurality of light-receiving elements includes a back-incident photodiode including a first semiconductor layer formed on the substrate and formed from a first conductive type semiconductor, a light absorbing layer formed on the first semiconductor layer and formed from a semiconductor, a second semiconductor layer formed on the light absorbing layer and formed from a second conductive type semiconductor, a reflection layer formed on the second semiconductor layer, a first electrode connected to the second semiconductor layer, and a second electrode connected to the first semiconductor layer, wherein each of the first reflection surface and the second reflection surface includes an inclined surface forming one flat surface formed from a main surface of the substrate on which each light-receiving element is formed to a back surface side of the substrate, and an angle formed between the main surface of the substrate in a region where each light-receiving element is formed and each of the first reflection surface and the second reflection surface is an obtuse angle.

A light-receiving device according to the present disclosure includes: a plurality of light-receiving elements arranged in a row on a substrate; a reflection surface formed on the substrate on a side of the row of the plurality of light-receiving elements to extend in an arrangement direction of the plurality of light-receiving elements; and a reverse mesa groove formed on the substrate between the plurality of light-receiving elements adjacent to each other in the arrangement direction, wherein each of the plurality of light-receiving elements includes a back-incident photodiode including a first semiconductor layer formed on the substrate and formed from a first conductive type semiconductor, a light absorbing layer formed on the first semiconductor layer and formed from a semiconductor, a second semiconductor layer formed on the light absorbing layer and formed from a second conductive type semiconductor, a reflection layer formed on the second semiconductor layer, a first electrode connected to the second semiconductor layer, and a second electrode connected to the first semiconductor layer, wherein the reflection surface includes an inclined surface forming one flat surface formed from a main surface of the substrate on which each light-receiving element is formed to a back surface side of the substrate, an angle formed between the main surface of the substrate in a region where each light-receiving element is formed and the reflection surface is an obtuse angle, and a cross-section perpendicular to the arrangement direction of the reverse mesa groove has a shape which becomes wider toward a bottom surface of the reverse mesa groove.

In one configuration example of the light-receiving device, the first electrode is formed from a metal and is formed on the second semiconductor layer, and the reflection layer includes the first electrode.

In one configuration example of the light-receiving device, the reflection layer includes a metal layer formed on the second semiconductor layer with a dielectric layer interposed therebetween.

A light receiver according to the present disclosure includes: any one of the above-described light-receiving devices; and an optical component configured to emit light to be incident from a side of the substrate toward the first reflection surface, wherein the optical component is disposed at a position other than an optical path of light which is incident from the side of the substrate toward the first reflection surface, is reflected by the first reflection surface, passes through the light absorbing layer, is reflected by the reflection layer, passes through the light absorbing layer, is reflected by the second reflection surface, and is emitted from the side of the substrate.

Effects of Embodiments of the Invention

As described above, according to the present disclosure, because the reflection surface which extends in the arrangement direction of the plurality of light-receiving elements is formed on the substrate, it is possible to suppress crosstalk between the arranged light-receiving elements.

DETAILED DESCRIPTION OF ILLUSTRATIVE EMBODIMENTS

Hereinafter, a light-receiving device according to an embodiment of the present disclosure will be described.

First Embodiment

Figure 1A:
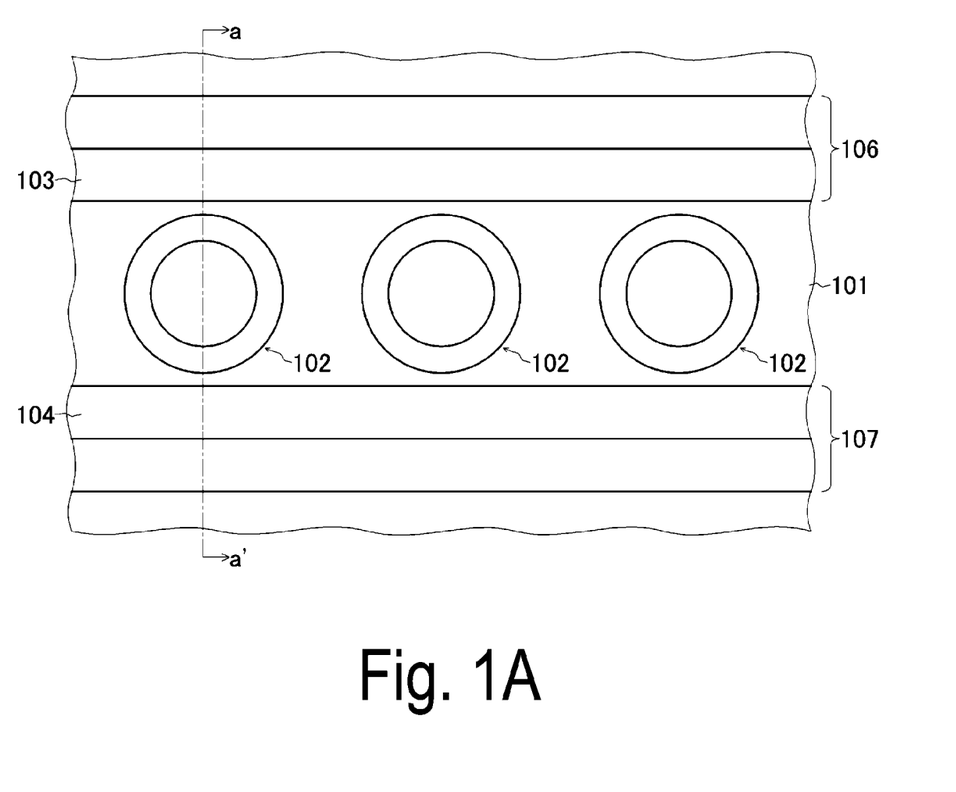
FIG. 1A is a plan view illustrating a configuration of a light-receiving device of a first embodiment of the present disclosure.
Figure 1B:
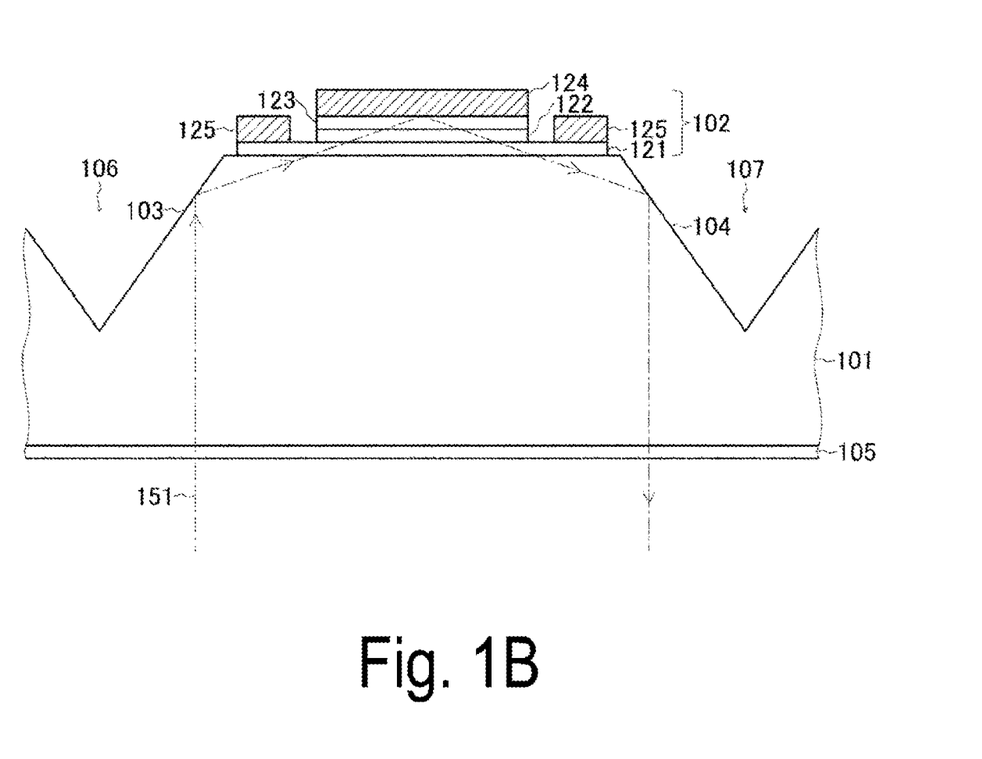
FIG. 1B is a cross-sectional view illustrating a configuration of the light-receiving device of the first embodiment of the present disclosure.

First, a light-receiving device according to a first embodiment of the present disclosure will be described with reference to FIGS. 1A and 1B. Additionally, FIG. 1B illustrates a cross-section taken along a line a-a' of FIG. 1A.

This light-receiving device includes a plurality of light-receiving elements 102 which are arranged in a row on a main surface of a substrate 101 and a first reflection surface 103 and a second reflection surface 104 which extend in the arrangement direction with the row of the plurality of light-receiving elements 102 interposed therebetween and are formed on the substrate 101. Further, an antireflective film 105 is formed on the back surface of the substrate 101.

Each light-receiving element 102 includes a first semiconductor layer 121 which is formed on the substrate 101 and is formed from a first conductive type semiconductor, a light absorbing layer 122 which is formed on the first semiconductor layer 121 and is formed from a semiconductor, and a second semiconductor layer 123 which is formed on the light absorbing layer 122 and is formed from a second conductive type semiconductor. Further, the light-receiving element 102 includes a first electrode 124 which is connected to the second semiconductor layer 123 and a second electrode 125 which is connected to the first semiconductor layer 121. Further, in the light-receiving element 102, a reflection layer formed by the first electrode 124 formed from a metal is disposed on the second semiconductor layer 123. Further, the first electrode 124 may be formed on the second semiconductor layer 123 with a dielectric layer (not illustrated) interposed therebetween and the reflection layer can include these layers. The light-receiving element 102 is a so-called back-incident photodiode.

For example, the substrate 101 is formed from InP, the first semiconductor layer 121 is formed from n-type InP, the light absorbing layer 122 is formed from InGaAs, and the second semiconductor layer 123 is formed from p-type InGaAs. In these cases, the first conductive type is n-type and the second conductive type is p-type.

The light absorbing layer 122 and the second semiconductor layer 123 are patterned into a desired shape, a portion of the first semiconductor layer 121 is exposed in the planar direction, and the second electrode 125 is formed in the exposed region. For example, the light absorbing layer 122 and the second semiconductor layer 123 are formed into a cylindrical shape having a diameter of about 22 μm. Further, the first semiconductor layer 121 is formed into a cylindrical shape having a diameter of about 25 μm. Further, although not illustrated in the drawings, a lead-out wire is connected to each of the first electrode 124 and the second electrode 125.

Further, each of the first reflection surface 103 and the second reflection surface 104 includes an inclined surface forming one flat surface formed from the main surface of the substrate 101 on which the light-receiving element 102 is formed to the back surface side of the substrate 101. Further, an angle formed between the main surface of the substrate 101 in the region where the light-receiving element 102 is formed and each of the first reflection surface 103 and the second reflection surface 104 is an obtuse angle.

For example, this inclined surface can be used as the first reflection surface 103 by forming a V-groove 106 extending in the arrangement direction of the plurality of light-receiving elements 102 in the substrate 101. Similarly, this inclined surface can be used as the second reflection surface 104 by forming a V-groove 107 extending in the arrangement direction of the plurality of light-receiving elements 102 in the substrate 101. The V-groove 106 and the V-groove 107 are formed in parallel in the arrangement direction with the plurality of arranged light-receiving elements 102 interposed therebetween.

For example, the substrate 101 is formed from InP, and a surface orientation of the main surface is (001) or is equivalent thereto, thereby the V-groove can be formed. First, a resist pattern having a rectangular opening in a plan view at positions where the V-groove 106 and the V-groove 107 of the substrate 101 are formed is formed on the substrate 101 by a known photolithography technique. Next, this resist pattern is used as a mask, and wet etching is performed using an etching solution such as a mixture of bromine and methanol.

This etching is so-called crystal anisotropic etching, and a surface on the (111)A plane, which is hard to be etched, appears as the etching progresses, so that an inclined surface is formed. An angle of this inclined surface is about 54.7 with respect to the main surface of the substrate 101 on the (001) plane. Each of the first reflection surface 103 and the second reflection surface 104 formed in this way has an angle of about 125.3 with respect to the main surface of the substrate 101 in a region where the light-receiving element 102 is formed. For example, the above-described processing may be performed so that the extension direction of the V-groove 106 and the V-groove 107 is parallel to the orientation flat of the substrate 101 formed from InP.

Signal light 151 which passes through the antireflective film 105 and is incident from the back surface of the substrate 101 is reflected by the first reflection surface 103, passes through the light absorbing layer 122, and is reflected by the reflection layer formed by the first electrode 124. The signal light 151 which is reflected by this reflection layer passes through the light absorbing layer 122 again. Thus, in the first embodiment, for example, when signal light having a wavelength of 1.55 μm is incident on the light absorbing layer 122 having a thickness of 400 nm, the coupling efficiency which is ideally about 40% in the case of the vertical incidence can be improved to about 80%.

Additionally, because the coupling efficiency is less than 100%, the signal light 151 which cannot be absorbed is emitted from the light absorbing layer 122 to the outside. The light which is not absorbed by the light absorbing layer 122 but passes therethrough is reflected by the second reflection surface 104 and is emitted from the back surface of the substrate 101 to pass through the antireflective film 105. In this way, according to the first embodiment, because the light which is not absorbed by the light absorbing layer 122 but passes through the light absorbing layer 122 is emitted from the substrate back surface, the light is not incident on the other light-receiving elements 102 and does not cause crosstalk.

The light-receiving device according to the first embodiment and an optical component that emits light incident from the side of the substrate 101 toward the first reflection surface 103 are assembled and used as a light receiver. The optical component is disposed at a position other than an optical path of light which is incident from the side of the substrate 101 toward the first reflection surface 103, is reflected by the first reflection surface 103, passes through the light absorbing layer 122, is reflected by the reflection layer, passes through the light absorbing layer 122 again, is then reflected by the second reflection surface 104, and is emitted from the side of the substrate 101.

Figure 2:
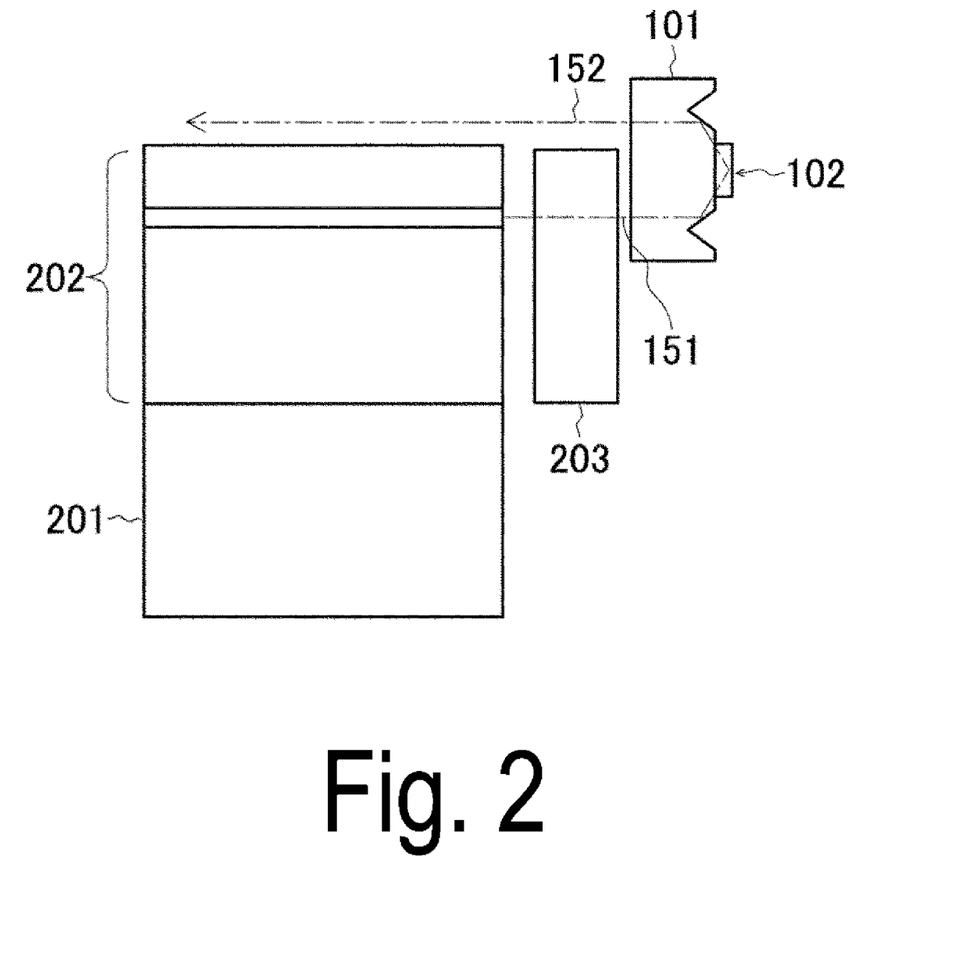
FIG. 2 is a configuration diagram illustrating a partial configuration of a light receiver that uses the light-receiving device of the embodiment of the present disclosure.

In the light receiver, for example, as illustrated in FIG. 2, a planar silica optical waveguide 202 which is an optical component fixed onto a pedestal 201, an optical system 203 which is an optical component formed by a lens array, and the like are assembled to the light-receiving device according to the first embodiment. The signal light 151 which is emitted from the planar silica optical waveguide 202, passes through the optical system 203, and is incident from the side of the substrate 101 toward the first reflection surface 103 is received by the light-receiving device. The signal light 151 is incident from the back surface side of the substrate 101. The signal light 151 which is received by the light-receiving element 102 and is not absorbed thereto is emitted from the back surface side of the substrate 101.

In such a light receiver, the light-receiving device including the substrate 101 on which the plurality of light-receiving elements 102 are formed is, for example, flip-chip mounted on a subcarrier (not illustrated), so that a photodiode chip on carrier (PDCoC) is formed. The planar silica optical waveguide 202 and the optical system 203 which are optical components are not arranged on an optical path of light 152 emitted from the light-receiving device.

Incidentally, when light is reflected by the first reflection surface 103 and is incident on the light absorbing layer 122 at an angle with respect to the flat surface of the substrate 101, the light receiving sensitivity varies according to the ratio of the TM mode component and the TE mode component of the signal light 151. In the case where the sensitivity is a quality determination criterion, the yield may be reduced. However, in the case of light emitted from a waveguide type optical filter such as that described in Non Patent Literature 1, the ratio of the modes of the polarization components described above can be controlled by the structure of the exit end of the waveguide type optical filter and thus the above-described problems do not arise.

As described above, according to the first embodiment, because the first reflection surface 103 and the second reflection surface 104 are formed on the substrate 101 to extend in the arrangement direction with the row of the plurality of light-receiving elements 102 interposed therebetween, crosstalk between the arranged light-receiving elements 102 can be suppressed.

Second Embodiment

Figure 3A:
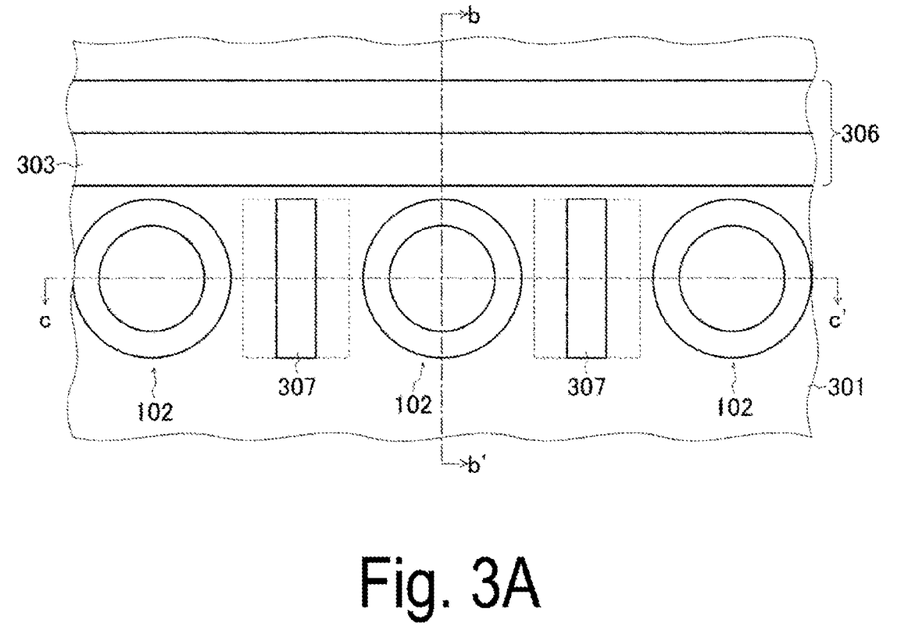
FIG. 3A is a plan view illustrating a configuration of a light-receiving device of a second embodiment of the present disclosure.
Figure 3B:
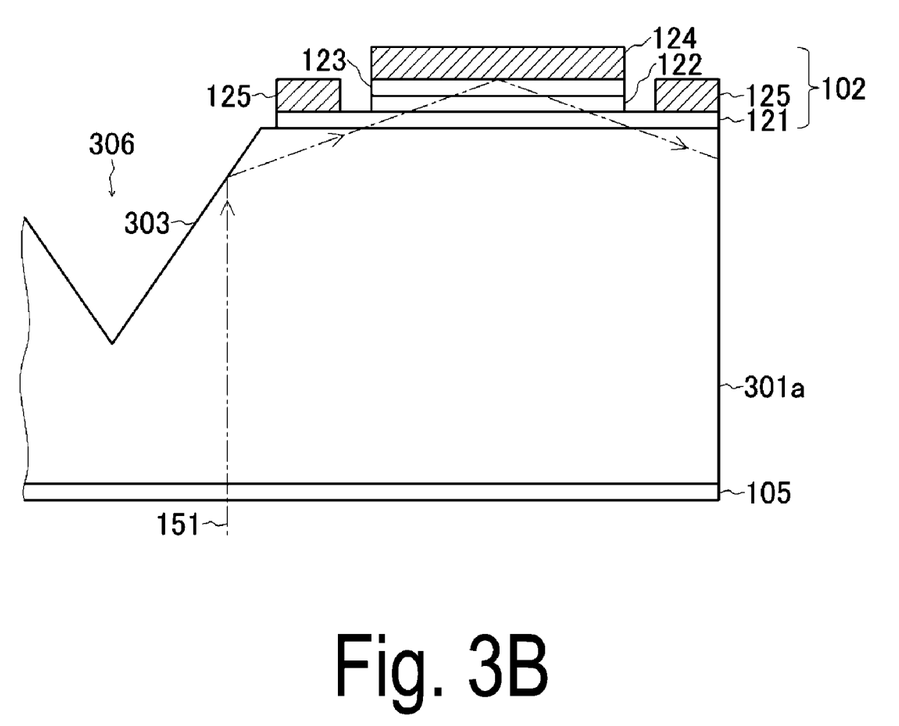
FIG. 3B is a cross-sectional view illustrating a configuration of the light-receiving device of the second embodiment of the present disclosure.
Figure 3C:
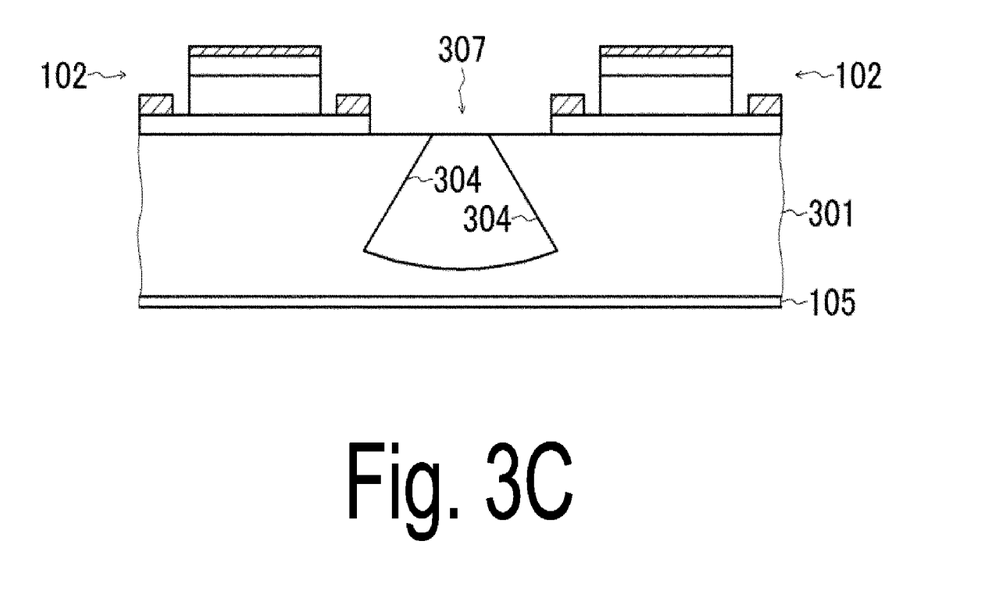
FIG. 3C is a cross-sectional view illustrating a configuration of the light-receiving device of the second embodiment of the present disclosure.

Next, a light-receiving device according to a second embodiment of the present disclosure will be described with reference to FIGS. 3A, 3B, and 3C. FIG. 3B illustrates a cross-section taken along a line b-b' of FIG. 3A and FIG. 3C illustrates a cross-section taken along a line c-c' of FIG. 3A.

This light-receiving device includes a plurality of light-receiving elements 102 which are arranged in a row on a main surface of a substrate 301, a reflection surface 303, and a reverse mesa groove 307. The reflection surface ss303 extends in the arrangement direction of the row of the plurality of light-receiving elements 102 and is formed on the substrate 301. Each reverse mesa groove 307 is formed in the substrate 301 between the plurality of light-receiving elements 102 which are adjacent to each other in the arrangement direction. The light-receiving element 102 is the same as that of the first embodiment. Further, an antireflective film 105 is formed on a back surface of the substrate 301 as in the first embodiment. For example, the substrate 301 is formed from InP as in the first embodiment.

Further, the reflection surface 303 includes an inclined surface forming one flat surface formed from the main surface of the substrate 301 where the light-receiving element 102 is formed to the back surface side of the substrate 301. Further, an angle formed between the main surface of the substrate 301 in a region where the light-receiving element 102 is formed and the reflection surface 303 is an obtuse angle.

For example, this inclined surface can be used as the reflection surface 303 by forming a V-groove 306 extending in the arrangement direction of the plurality of light-receiving elements 102 in the substrate 301. The V-groove 306 is formed in parallel to the arrangement direction of the plurality of light-receiving elements 102. A method of forming the V-groove 306 is the same as those of the V-groove 106 and the V-groove 107 of the first embodiment described above.

Further, a cross-section perpendicular to the arrangement direction of the reverse mesa groove 307 has a shape that becomes wider toward a bottom surface of the reverse mesa groove 307. The reverse mesa grooves 307 and the V-groove 306 can be formed simultaneously. A side surface 304 of the reverse mesa groove 307 extends in a direction perpendicular to the arrangement direction of the plurality of light-receiving elements 102. Thus, the extension direction of the side surface 304 is orthogonal to the extension direction of the reflection surface 303. Further, an angle formed between the main surface of the substrate 101 in a region where the light-receiving element 102 is formed and the side surface 304 adjacent to the light-receiving element 102 is an acute angle.

For example, the substrate 301 is formed from InP, and a surface orientation of a main surface is (001) or is equivalent thereto, thereby the V-groove 306 is formed as in the first embodiment, and the reverse mesa groove 307 can be formed simultaneously.

For example, a resist pattern having a rectangular opening in a plan view at positions where the V-groove 106 and the reverse mesa grooves 307 of the substrate 301 are formed is formed on the substrate 301 by a known photolithography technique. Next, this resist pattern is used as a mask, and wet etching is performed using an etching solution such as a mixture of bromine and methanol.

This etching is crystalline anisotropic etching and a surface on the (111)A plane, which is hard to be etched, appears as the etching progresses, so that an inclined surface is formed. An angle of this inclined surface is about 54.7 with respect to the main surface of the substrate 101 on the (001) plane. An angle formed between the first reflection surface 103 formed in this way and the main surface of the substrate 101 in a region where the light-receiving element 102 is formed is about 125.3. An angle formed between the side surface 304 and the main surface of the substrate 101 in a region where adjacent light-receiving element 102 is formed is about 54.7. For example, the above-described processing may be performed so that the extension direction of the V-groove 106 is parallel to the orientation flat of the substrate 101 formed from InP and the extension direction of the reverse mesa groove 307 is perpendicular.

Because the reverse mesa grooves 307 and the V-groove 106 can be simultaneously formed under the same conditions, and a new process is not required for forming the reverse mesa grooves 307, the cost does not increase.

In the second embodiment, the signal light 151 which passes through the antireflective film 105 and is incident from the back surface of the substrate 301 is reflected by the reflection surface 303, passes through the light absorbing layer 122, and is reflected by the reflection layer formed by the first electrode 124. The signal light 151 which is reflected by this reflection layer passes through the light absorbing layer 122 again. Thus, also in the second embodiment, for example, when signal light having a wavelength of 1.55 μm is incident on the light absorbing layer 122 having a thickness of 400 nm, the coupling efficiency which is ideally about 40% in the case of vertical incidence can be improved to about 80%.

Further, because the coupling efficiency is less than 100%, the signal light 151 which is not absorbed is emitted from the light absorbing layer 122 to the outside. The light which is not absorbed by the light absorbing layer 122 but passes therethrough is emitted from an end surface 301a of the substrate 301 formed in parallel to the arrangement direction of the plurality of light-receiving elements 102. The end surface 301a can include, for example, a side surface formed by cutting the substrate 301. The light emitted from the end surface 301a is not incident on the other light-receiving elements 102 and does not cause crosstalk.

Here, a part of the signal light 151 reaching the end surface 301a does not pass through the end surface 301a but is reflected thereby. There is a probability that this reflected signal light 151 will be incident on the other light-receiving elements 102 and cause crosstalk. In contrast, because each reverse mesa groove 307 is provided in the second embodiment, signal light which is reflected by the end surface 301a and is directed toward the other light-receiving elements 102 is reflected by the side surface 304 and is emitted from the back surface of the substrate 301. Therefore, the signal light is not incident on the other light-receiving elements 102 and does not cause crosstalk.

As described above, according to the second embodiment, the reflection surface 303 is formed on the substrate 301 to extend in the arrangement direction of the row of the plurality of light-receiving elements 102, and each reverse mesa groove 307 is formed in the substrate 301 between the light-receiving elements 102 adjacent to each other in the arrangement direction. Thus, it is possible to suppress crosstalk between the arranged light-receiving elements 102.

Figure 4:
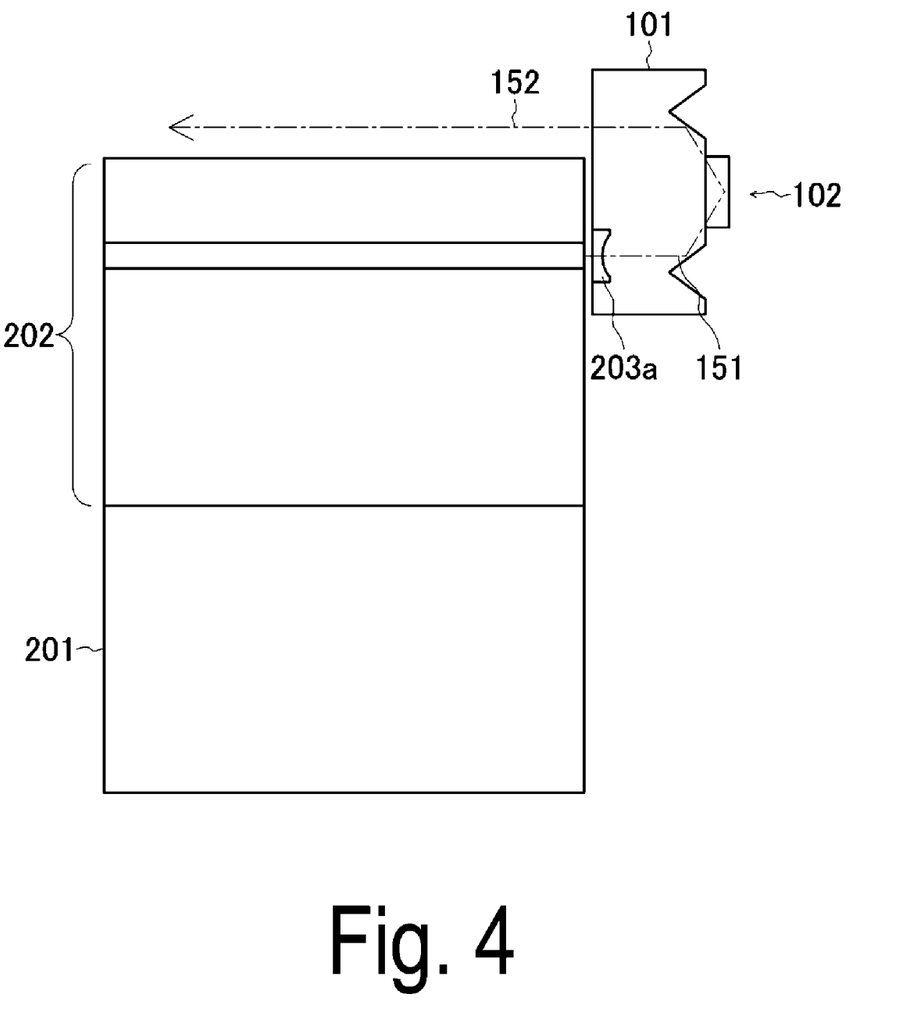
FIG. 4 is a configuration diagram illustrating a partial configuration of another light receiver that uses the light-receiving device of the embodiment of the present disclosure.

The light-receiving device according to the present disclosure and the optical component can be assembled and used as a light receiver as illustrated in FIG. 4. In the light receiver, the signal light 151 which is emitted from the planar silica optical waveguide 202 fixed onto the pedestal 201 and passes through the optical system 203a formed on the back surface of the substrate 101 is received by the light-receiving device. In this example, the optical system 203a can include a lens shape formed on the back surface of the substrate 101. In this case, the optical system 203a can be regarded as a part of the light-receiving device and can be regarded as an optical component assembled to the light-receiving device. In this case, the optical component is also disposed at a position other than an optical path of the light 152 emitted from the light-receiving device.

Further, the light-receiving element 102 can include a well-known avalanche photodiode.

As described above, according to the present disclosure, because the reflection surfaces which extend in the arrangement direction of the plurality of light-receiving elements are formed on the substrate, it is possible to suppress crosstalk between the arranged light-receiving elements.

The present disclosure is not limited to the embodiments described above, and it is obvious that many modifications and combinations can be implemented by a person having ordinary knowledge in the field within the technical spirit of the present disclosure.

REFERENCE SIGNS LIST

101 Substrate
102 Light-receiving element
103 First reflection surface
104 Second reflection surface
105 Antireflective film
106 V-groove
107 V-groove
151 Signal light.

The invention claimed is:

1. A light-receiving device comprising:
a substrate comprising a first reflection surface and a second reflection surface; and
a plurality of light-receiving elements arranged in a row on a main surface of the substrate;
wherein the first reflection surface and the second reflection surface extend along the row of the plurality of light-receiving elements,
wherein the plurality of light-receiving elements are between the first reflection surface and the second reflection surface,
wherein each of the plurality of light-receiving elements includes a back-incident photodiode including:
a first semiconductor layer on the substrate and made of a first conductive type semiconductor;
a light absorbing layer on the first semiconductor layer and made of a semiconductor;
a second semiconductor layer on the light absorbing layer and made of a second conductive type semiconductor;
a reflection layer on the second semiconductor layer;
a first electrode connected to the second semiconductor layer; and
a second electrode connected to the first semiconductor layer,
wherein each of the first reflection surface and the second reflection surface includes an inclined surface extending from the main surface of the substrate to a back surface of the substrate,
wherein an angle formed between the main surface of the substrate and the first reflection surface is obtuse, and
wherein an angle formed between the main surface of the substrate and the second reflection surface is obtuse.

2. The light-receiving device according to claim 1,
wherein the first electrode is made of a metal and is disposed on the second semiconductor layer, and
the reflection layer includes the first electrode.

3. The light-receiving device according to claim 1,
wherein the reflection layer includes a metal layer on the second semiconductor layer with a dielectric layer interposed therebetween.

4. A light receiver comprising:
the light-receiving device according to claim 1; and
an optical component configured to emit light to be incident from a side of the substrate toward the first reflection surface,
wherein the optical component is disposed at a position other than an optical path of light which is incident from the side of the substrate toward the first reflection surface, is reflected by the first reflection surface, passes through the light absorbing layer, is reflected by the reflection layer, passes through the light absorbing layer, is reflected by the second reflection surface, and is emitted from the side of the substrate.

5. A light-receiving device comprising:
a substrate comprising a first reflection surface and a second reflection surface; and
a plurality of light-receiving elements arranged in a row on a main surface of the substrate;
wherein the first reflection surface and the second reflection surface extend along the row of the plurality of light-receiving elements,
wherein the plurality of light-receiving elements are between the first reflection surface and the second reflection surface,
wherein each of the plurality of light-receiving elements includes a back-incident photodiode,
wherein each of the first reflection surface and the second reflection surface includes an inclined surface extending from the main surface of the substrate to a back surface of the substrate,
wherein an angle formed between the main surface of the substrate and the first reflection surface is obtuse, and
wherein an angle formed between the main surface of the substrate and the second reflection surface is obtuse.

6. The light-receiving device according to claim 5,
wherein the back-incident photodiode of each of the plurality of light-receiving elements includes:
a first semiconductor layer on the substrate and made of a first conductive type semiconductor;
a light absorbing layer on the first semiconductor layer and made of a semiconductor;
a second semiconductor layer on the light absorbing layer and made of a second conductive type semiconductor;
a reflection layer on the second semiconductor layer;
a first electrode connected to the second semiconductor layer; and
a second electrode connected to the first semiconductor layer.

7. The light-receiving device according to claim 6,
wherein the first electrode is made of a metal and is disposed on the second semiconductor layer, and
the reflection layer includes the first electrode.

8. The light-receiving device according to claim 6,
wherein the reflection layer includes a metal layer on the second semiconductor layer with a dielectric layer interposed therebetween.

* * * * *